US012473639B2

(12) United States Patent
Lerner et al.

(10) Patent No.: US 12,473,639 B2
(45) Date of Patent: Nov. 18, 2025

(54) METHODS FOR FORMING FILMS ON SUBSTRATES

(71) Applicant: Applied Materials, Inc., Santa Clara, CA (US)

(72) Inventors: Alexander N. Lerner, San Jose, CA (US); Roey Shaviv, Palo Alto, CA (US); Prashanth Kothnur, San Jose, CA (US); Satish Radhakrishnan, San Jose, CA (US); Xiaozhou Che, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 17/971,692

(22) Filed: Oct. 24, 2022

(65) Prior Publication Data

US 2023/0042777 A1      Feb. 9, 2023

Related U.S. Application Data

(62) Division of application No. 16/854,893, filed on Apr. 21, 2020, now Pat. No. 11,505,863.

(Continued)

(51) Int. Cl.
    *C23C 16/448*      (2006.01)
    *C23C 14/00*      (2006.01)
    (Continued)

(52) U.S. Cl.
    CPC .......... *C23C 16/4481* (2013.01); *C23C 14/00* (2013.01); *C23C 16/00* (2013.01);
    (Continued)

(58) Field of Classification Search
    CPC ................ C23C 16/52; C23C 16/4584; C23C 16/4588; C23C 16/45574; C23C 16/448; C23C 16/45561
See application file for complete search history.

(56) References Cited

U.S. PATENT DOCUMENTS

2003/0181060 A1*    9/2003    Asai .................. C23C 16/45527
                                                             438/758
2004/0050325 A1*    3/2004    Samoilov .......... C23C 16/45561
                                                             156/345.33

(Continued)

FOREIGN PATENT DOCUMENTS

EP           1252363 B1      9/2003
JP          2002060954 A      2/2002
(Continued)

OTHER PUBLICATIONS

International Search Report and the Written Opinion of the International Searching Authority for PCT/US2020/029156 mailed Jul. 22, 2020, 14 pages.

(Continued)

*Primary Examiner* — Joseph A Miller, Jr.
(74) *Attorney, Agent, or Firm* — Patterson + Sheridan, LLP

(57) ABSTRACT

One or more embodiments described herein generally relate to methods and systems for forming films on substrates in semiconductor processes. In embodiments described herein, a process system includes different materials each contained in separate ampoules. Each material is flowed into a separate portion of a showerhead contained within a process chamber via a heated gas line. From the showerhead, each material is flowed on to a substrate that sits on the surface of a rotating pedestal. Controlling the mass flow rate out of the showerhead and the rotation rate of the pedestal helps result in films with desirable material domain sizes to be deposited on the substrate.

14 Claims, 5 Drawing Sheets

Related U.S. Application Data

(60) Provisional application No. 62/855,672, filed on May 31, 2019.

(51) Int. Cl.
*C23C 16/00* (2006.01)
*C23C 16/455* (2006.01)
*C23C 16/458* (2006.01)
*C23C 16/52* (2006.01)

(52) U.S. Cl.
CPC .... *C23C 16/45565* (2013.01); *C23C 16/4588* (2013.01); *C23C 16/52* (2013.01)

(56) References Cited

U.S. PATENT DOCUMENTS

| | | |
|---|---|---|
| 2005/0087132 A1 | 4/2005 | Dickey et al. |
| 2009/0061646 A1* | 3/2009 | Chiang ............. C23C 16/45548 257/E21.24 |
| 2012/0064698 A1* | 3/2012 | Olgado ............. C23C 16/45565 118/715 |
| 2015/0275358 A1 | 10/2015 | Smith |
| 2016/0102401 A1 | 4/2016 | Takahashi et al. |
| 2017/0314120 A1 | 11/2017 | Gebele et al. |
| 2017/0335450 A1 | 11/2017 | Collins et al. |
| 2020/0087790 A1* | 3/2020 | Lerner ................ C23C 16/4557 |

FOREIGN PATENT DOCUMENTS

| | | |
|---|---|---|
| JP | 2010-070398 A | 4/2010 |
| JP | 2016-081945 A | 5/2016 |
| KR | 2018-0128515 A | 12/2018 |

OTHER PUBLICATIONS

JP Office Action dated Feb. 13, 2023 for Application No. 2021-569864. (with Translation).
CN Office Action dated Apr. 28, 2023 for Application No. 202080034861.5.
Korean Office Action dated Jan. 9, 2024 for Application No. 10-2021-7040626.

* cited by examiner

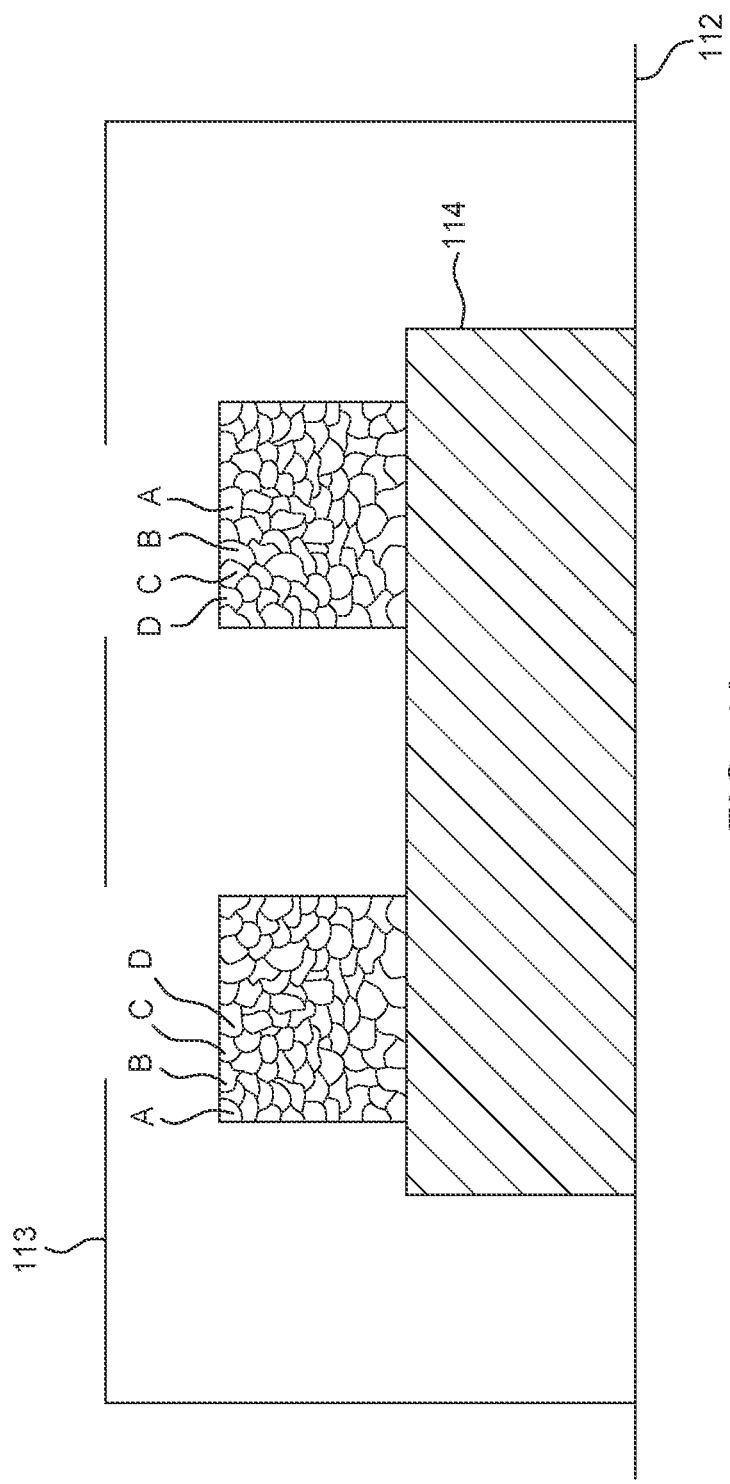

METHODS FOR FORMING FILMS ON SUBSTRATES

CROSS-REFERENCE TO RELATED APPLICATIONS

This application is a divisional application of U.S. patent application Ser. No. 16/854,893, filed Apr. 21, 2020, which claims priority to U.S. Provisional Patent Application Ser. No. 62/855,672, filed on May 31, 2019, which herein are incorporated by reference.

BACKGROUND

Field

One or more embodiments described herein generally relate to semiconductor processes, and more particularly, to methods and systems for forming films on substrates in semiconductor processes.

Description of the Related Art

Organic vapor deposition is becoming increasingly relevant in building semiconductor devices and other optical devices. Vapor deposition processes generally include heating materials that are maintained at a desired pressure to a desired temperature such that the heated material is vaporized and then allowed to be transferred to a substrate where the vaporized material condenses onto a surface of the substrate. Organic vapor deposition is often used to form CMOS image sensors. However, organic vapor deposition can also be used to form organic light emitting diodes (OLEDs), organic photodetectors, solar cells, and other similar devices. These devices are used in the manufacture of television screens, computer monitors, mobile phones, and other hand-held devices for displaying information. The range of colors, brightness, and viewing angles possible with OLED displays are greater than that of traditional LED displays because OLED pixels directly emit light and do not require a back light, and thus lessen the energy consumption of the formed device. Further, OLEDs can be manufactured onto flexible substrates, resulting in further device applications as well.

Although these devices are useful, there are many challenges encountered in the manufacture of such display devices. To fabricate the stacks with high efficiency, the co-deposition of materials is desired. When co-depositing materials onto a substrate, the placement of the materials on the surface of the substrate is important to assure that the resulting film layer(s) on the substrate are able to the form a functioning device. Without the control of the placement of the materials, the resulting deposited materials within a formed layer may form undesirable domain sizes and morphologies that impede charge separation and extraction in organic electronic devices. In some device configurations, it is desirable to deposit the materials onto a substrate such that multiple materials mix within a single formed layer or the multiple materials form a superlattice structure. However, conventional vapor deposition processes are not able to reliably form these types of multiple material containing layers, or composite layers.

Accordingly, there is a need for methods that form resulting films of desirable mixed ratios, domain sizes, and morphologies when co-depositing a substrate with multiple materials.

SUMMARY

One or more embodiments described herein generally relate to methods of forming films on substrates in semiconductor processes.

In one embodiment, a method for forming a film on a substrate includes controlling a temperature of and a pressure within a processing volume of each of a plurality of ampoules, wherein different materials are disposed within the process volume of each of the plurality of ampoules, the process volume of each of the plurality of ampoules are in fluid communication with one of a plurality of portions of a showerhead that is coupled to a process volume of a process chamber, and the controlled temperature is configured to cause each of the different materials to evaporate within each of the process volumes and flow to one of the plurality of portions of the showerhead; controlling a flow rate of each of the different materials from each of the plurality of portions of the showerhead and into the process volume of the process chamber by controlling the temperature of each of the plurality of portions of the showerhead; controlling a pressure within the process chamber; and controlling a rotation rate of a substrate on a pedestal disposed within the process volume of the process chamber, wherein the rotating substrate is exposed to the flow of different materials provided from each of the plurality of portions of the showerhead.

In another embodiment, a method for forming a film on a substrate includes controlling a temperature of and a pressure within a processing volume of a first ampoule, wherein a first material is disposed within the process volume of the first ampoule, the process volume of the first ampoule is in fluid communication with a first portion of a plurality of portions of a showerhead that is coupled to a process volume of a process chamber, and the controlled temperature is configured to cause the first material to evaporate within the process volume and flow to the first portion of the showerhead; controlling a temperature of and pressure within a process volume of a second ampoule, wherein a second material is disposed within the process volume of the second ampoule, the process volume of the second ampoule is in fluid communication with a second portion of the plurality of portions of the showerhead that is coupled to the process volume of the process chamber, and the controlled temperature is configured to cause the second material to evaporate within the process volume and flow to the second portion of the showerhead controlling a flow rate of the first material from the first portion of the showerhead and into the process volume of the process chamber by controlling the temperature of the first portion of the plurality of portions of the showerhead; controlling a flow rate of the second material from the second portion of the showerhead and into the process volume of the process chamber by controlling the temperature of the second portion of the plurality of portions of the showerhead; controlling a pressure within the process chamber; controlling a rotation rate of a substrate on a pedestal disposed within the process volume of the process chamber, wherein the rotating substrate is simultaneously or sequentially exposed to the flow of the first material and the second material provided from the first portion and the second portion of the plurality of portions of the showerhead.

One or more embodiments described herein generally relate to process systems for forming films on substrates in semiconductor processes.

In one embodiment, a process system for forming a film on a substrate includes a plurality of ampoules; a process chamber comprising: a showerhead, wherein the showerhead comprises a plurality of portions; and a pedestal; a plurality of delivery lines, wherein each delivery line of the plurality of delivery lines is connected from one of the plurality of ampoules to one of the plurality of portions of the showerhead; and a controller configured to regulate operation of the process system, wherein the controller comprises a memory containing instructions for execution on a processor comprising: controlling a temperature of and a pressure within a processing volume of each of the plurality of ampoules, wherein different materials are disposed within the process volume of each of the plurality of ampoules, the process volume of each of the plurality of ampoules are in fluid communication with one of the plurality of portions of the showerhead that is coupled to a process volume of the process chamber, and the controlled temperature is configured to cause each of the different materials to evaporate within each of the process volumes and flow to one of the plurality of portions of the showerhead; controlling a flow rate of each of the different materials from each of the plurality of portions of the showerhead and into the process volume of the process chamber by controlling the temperature of each of the plurality of portions of the showerhead; controlling a pressure within the process chamber; and controlling a rotation rate of a substrate on the pedestal disposed within the process volume of the process chamber, wherein the rotating substrate is exposed to the flow of different materials provided from each of the plurality of portions of the showerhead.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4B are schematic views of the process chamber after the method shown in FIG. 3 is performed according to some embodiments described herein.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to methods and systems for forming films on substrates in one or more deposition processes. In embodiments described herein, a process system includes different evaporable materials that are each contained in separate ampoules. Each evaporable material flows into a separate portion of a showerhead contained within a process chamber via a heated gas line. From the showerhead, each material is directed onto a substrate that sits on the surface of a rotating pedestal. Controlling process parameters of the process system while the materials flow from the ampoules to the substrate can result in multiple materials mixed within a single formed layer or multiple materials forming a superlattice structure. By controlling the process parameters, the relative composition of a formed layer that includes multiple deposited materials can also be achieved.

In embodiments described herein, some parameters that affect the composition of the resulting films across the surface of the substrate are the mass flow rate out of the showerhead, the temperature of the substrate, and the rotation rate of the pedestal. Some factors that determine the mass flow rate out of the showerhead are the temperature of the ampoule that is connected to the showerhead, the temperature gradient formed in the fluid delivery system extending from the ampoules to the showerhead, the temperature of the showerhead, the flow restriction created by openings within each showerhead portion, the flow regime (e.g., molecular flow) of the material within different portions of the process system, and the pressure of the process chamber in which the substrate resides during processing. Controlling the mass flow rate and the rotational speed of the pedestal results in a deposition process that is able to form films with desirable compositions on the surface of the substrate. As such, the resulting films have desired domain sizes and morphologies, solving the problem of resulting films having undesired domain sizes and morphologies that impede charge separation and extraction in organic electronic devices.

Figure 1:
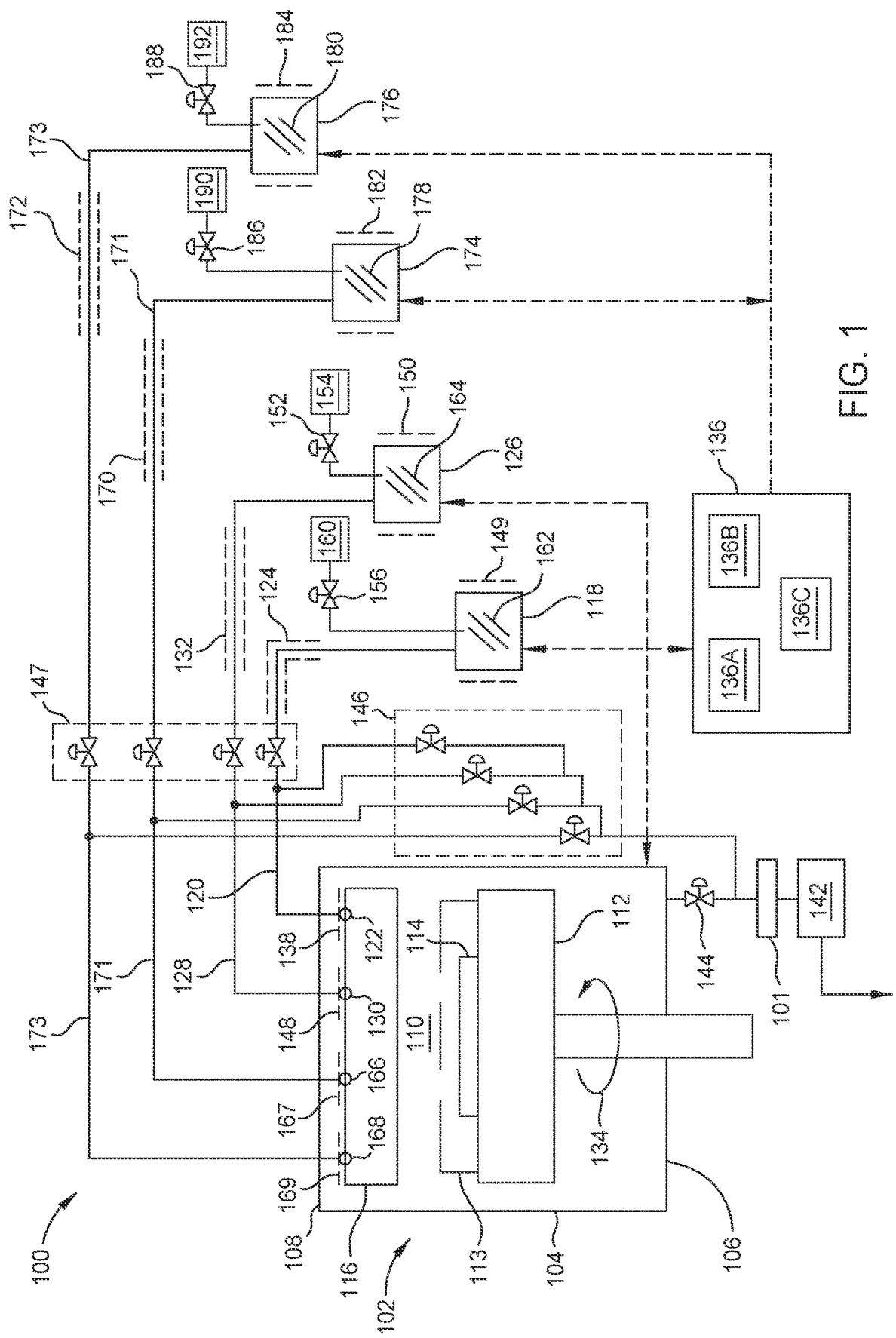
FIG. 1 is schematic view of a process system according to at least one embodiment described herein.

FIG. 1 is a schematic view of process system 100 according to at least one embodiment described herein. The process system 100 includes a process chamber 102. The process chamber 102 is defined by side walls 104, a bottom 106, and a top 108, forming a process volume 110. The process chamber 100 is configured to process a substrate, such as a substrate 114, within the process volume 110 of the process chamber 102. The substrate 114 is supported by a pedestal 112 disposed in the process chamber 102. A mask 113 with openings is positioned above the substrate 114. The mask 113 is positioned such that the materials flow onto separate regions of the substrate 114, forming suitable devices. In some embodiments, the process chamber 102 may be a chemical vapor deposition (CVD) chamber, atomic layer deposition (ALD) chamber, or physical vapor deposition (PVD) chamber configured to perform process material deposition, such as organic vapor deposition in accordance with the present disclosure. However, other chambers can also be used and modified with the teachings provided herein.

In some embodiments, a material layer (not shown), or derivatives thereof may be formed, condensed, or deposited by a deposition process on the substrate 114 by separately controlling the mass flow rate of each of the materials, which each require different evaporation temperatures. As such, embodiments herein cannot be evaporated through a conventional showerhead. In some embodiments, some of material combinations used can be a CuPc:C60 mix; a CBP:Ir(ppy)3 mix; a MoO3:Ag mix; a distributed Bragg reflector (DBR) superlattice structure (MgF2/SiOx pairs for example), and/or other similar combinations. However, in embodiments described herein, a showerhead 116 is provided that includes a first portion 122, a second portion 130, a third portion 166, and a fourth portion 168. Although four portions are shown in FIG. 1, other showerheads can be provided that include any number of portions. Using the multiple portions, the showerhead 116 is configured to deposit multiple process materials to form desirable films on the substrate 114, which is described in more detail below.

As shown in FIG. 1, the process system 100 includes a first ampoule 118, a second ampoule 126, a third ampoule 174, and a fourth ampoule 176. A first material 162 is contained within a process volume of the first ampoule 118, a second material 164 is contained within a process volume of the second ampoule 126, a third material 178 is contained within a process volume of the third ampoule 174, and a fourth material 180 is contained within a process volume of the fourth ampoule 176. The first ampoule 118 delivers the first material 162 to the first portion 122 of the showerhead 116 via a first delivery line 120, the second ampoule 126 delivers the second material 162 to the second portion 130 of the showerhead 116 via a second delivery line 128, the third ampoule 174 delivers the third material 178 to the third portion 166 of the showerhead via a third delivery line 171, and the fourth ampoule 176 delivers the fourth material 180 to the fourth portion 168 of the showerhead 116 via a fourth delivery line 173. Although four ampoules are shown in FIG. 1, other embodiments can include any number of ampoules, each containing its own process material and each delivering the process material to a separate portion of a showerhead (e.g., the showerhead can contain has as many separated portions as different materials provided). Additionally, in other embodiments, two opposing portions of the showerhead 116 can connect to the same ampoule to deposit the same material. While not shown in FIG. 1, in one example, the first portion 122 and the third portion 166 of the showerhead 116 can be connected to the same ampoule, such as the first ampoule 118, via the first delivery line 120 to deposit the first material 162 on a substrate. In this example, the second portion 130 and the fourth portion 168 can be connected to the second ampoule 126, via the second delivery line 128, to deposit the second material 162 on the substrate.

In these embodiments, the temperature in the process system 100 is controlled by heating elements contained in different parts of the system. For example, in some embodiments, the first delivery line 120 is heated by a first delivery line heating element 124, the second delivery line 128 is heated by a second heating element 132, the third delivery line 171 is heated by a third delivery line heating element 170, and the fourth delivery line 173 is heated by a fourth delivery line heating element 172. Each of the first delivery line heating element 124, the second delivery line heating element 132, the third delivery line heating element 170, and the fourth delivery line element 172 help heat the first delivery line 120, the second delivery line 128, the third delivery line 171, and the fourth delivery line 172, respectively, preventing unwanted condensation. Similarly, the first ampoule 118 is heated by a first ampoule heating element 149, the second ampoule 126 is heated by a second ampoule heating element 150, the third ampoule 174 is heated by a third ampoule heating element 182, and the fourth ampoule 176 is heated by a fourth ampoule heating element 184. Likewise, the first portion 122 of the showerhead 116 is heated by a first portion heating element 138, the second portion 130 of the showerhead 116 is heated by a second portion heating element 148, the third portion 166 of the showerhead 116 is heated by a third portion heating element 167, and the fourth portion 168 of the showerhead 116 is heated by a fourth portion heating element 169.

Controlling the temperature throughout different portions of the process system 100 can be used to control the mass flow rate throughout different portions of the process system 100. When the temperature is increased, it causes an increase in the flow rate of the vaporized material in an open system due to a decrease in density of the vaporized material. When the temperature is decreased, it causes a decrease in flow rate due to an increase in density of the vaporized material. In embodiments described herein, the mass flow rate can be controlled without the use of a carrier gas. However, in other embodiments, carrier gases can be optionally provided.

In some embodiments, the pressure in the process system is controlled by a vacuum pump 142 and a valve 144. The vacuum pump 142 acts to remove process gases and air from the process system 100. The vacuum pump 142 is connected to the process chamber 102, and reduces the pressure within the process chamber 102 when the valve 144 is open. In some configurations, a cold trap 101 is used to capture unreacted precursor materials before entering the vacuum pump 142. In some embodiments, the vacuum pump 142 is also connected to each of the delivery lines 120, 128, 171, and 173 through one or more by-pass valves 146.

In some embodiments, each delivery line 120, 128, 171, and 173 has a dedicated shut-off valve, which is illustrated in FIG. 1 as a plurality of shut-off valves 147. Typically, the shut-off valves 147 are each used to separately control which of the materials 162, 164, 178, 180 flow from the ampoules 118, 126, 174, 176 into each portion 122, 130, 166, and 168 of the showerhead 116. For example, two of the shut-off valves 147 can be closed and two of the shut-off valves can be open, and thus prevent the flow of materials 162 and 180 into the showerhead 116, and allowing only materials 164 and 178 to flow into the showerhead 116. In another example, one of the shut-off valves 147 can be opened, while all of the other valves 147 are closed, thus allowing only the material 162 to flow into the showerhead 116. In another example, three of the shut-off valves 147 can be opened, and thus allow the flow of materials 162, 178, and 180 to flow into the showerhead 116, and thus preventing the second material 164 from flowing into the showerhead 116. In some cases, it is desirable to close all of the shut-off valves 147, to prevent the flow of all materials of the materials 162, 164, 178, 180 into the showerhead 116 so that the substrate can be transferred into or out of the processing volume 110 or some maintenance activity can be performed on the process chamber. In other embodiments, all of the shut-off valves 147 can be opened, allowing all of the materials of the materials 162, 164, 178, 180 to flow into the showerhead 116.

As discussed above, each delivery line 120, 128, 171, and 173 has a dedicated by-pass valve 146 that allows each respective delivery line to be in direct communication with the vacuum pump 142. The shut-off valves 146 allow the evaporated materials 162, 164, 178, 180 to be individually removed from the portions 122, 130, 166, and 168 of the showerhead 116. Controlling which materials 162, 164, 178, 180 are removed from the showerhead 116 advantageously allows the deposition processes to start and stop quickly, preventing residuals from forming on substrates. For example, one of the by-pass valves 146 can be opened to allow a residual material 164 in a portion of the second delivery line 128 and the second portion 130 of the showerhead to be removed and provided to the vacuum pump 142. In another example, two of the by-pass valves 146 are opened to allow a residual material 162 and 178 found in portions of the first delivery line 120 and the third delivery line 171, respectively, and the first portion 122 and the third portion 166 of the showerhead, respectively, to be removed and provided to the vacuum pump 142. In another example, all of the by-pass valves 146 can be closed, stopping the flow of all materials of the materials 162, 164, 178, 180 out of the showerhead 116. In another example, all of the by-pass valves 146 can be opened, allowing all of the materials of the materials 162, 164, 178, 180 to be removed from the showerhead and delivery lines and provided to the vacuum pump 142.

Optionally, in some embodiments, a first push gas source assembly 160, a second push gas source assembly 154, a third push gas source assembly 190, and a fourth push gas source assembly 192 are provided to help deliver the vaporized material to the process volume of the process system 100. The first push gas source assembly 160 delivers a first push gas (e.g., inert gas, such as Ar, $N_2$, He) through the first delivery line 120 when a valve 156 is open. The second push gas source assembly 154 delivers a second push gas (e.g., inert gas, such as Ar, $N_2$, He) through the second delivery line 128 when a valve 152 is open. The third push gas source assembly 190 delivers a third push gas (e.g., inert gas, such as Ar, $N_2$, He) through the third delivery line 171 when a valve 186 is open. The fourth gas source assembly 192 delivers a fourth push gas (e.g., inert gas, such as Ar, $N_2$, He) through the fourth delivery line 173 when a valve 188 is open.

In one example of a process used to deposit a film using a portion of the fluid delivery system, while the shut-off valve 147 attached to the delivery line 120 is in an initial closed state and the by-pass valve 146 that is connected to the delivery line 120 is closed, the first ampoule 118, the delivery line 120, and portion 122 of the showerhead are each heated to a desired temperature. At this stage the pressure in the ampoule 118, delivery line 120, and process volume 110 are pumped down to a high equilibrium pressure. The desired temperatures of the first ampoule 118, the delivery line 120, and portion 122 of the showerhead include temperatures that cause the first material 162 to vaporize and remain a vapor in the delivery line 120. To initiate the deposition process, the shut-off valve 147 attached to the delivery line 120 is opened and the by-pass valve 146 connected to the delivery line 120 remains closed, thus allowing the vaporized material to flow into the portion 122 of the showerhead and onto the substrate 114 disposed in the process volume. After a desired time has elapsed the shut-off valve 147 attached to the delivery line 120 is closed and the by-pass valve 146 that is connected to the delivery line 120 is opened to allow a residual material 162 found in portions of the first delivery line 120 and the first portion 122 of the showerhead to be removed and provided to the vacuum pump 142. In some cases, it is desirable to purge the first delivery line 120 and the first portion 122 of the showerhead with an inert gas provided from the gas source 160 before the shut-off valve 147 is closed and the by-pass valve 146 is opened.

In these embodiments, the pedestal 112 is configured to rotate as shown by the arrow 134 in FIG. 1. As will be described further below, the pedestal 112 is controlled to rotate at a speed such that it achieves desired deposited film results on the surface of the substrate 114. The deposited materials within a formed layer can form suitable devices, such as OLEDs, photodetectors, solar cells, or other optical devices. Controlling the speed of the rotation of the pedestal 112 solves the problem of resulting films having undesired domain sizes and morphologies that impede charge separation and extraction in organic electronic devices.

As discussed above, some parameters that affect the size of the regions formed within the resulting films are the mass flow rate out of the showerhead 116, pressure within the process volume 110, and the rotation rate of the pedestal 112. Some factors that determine the mass flow rate of material out of the showerhead 116 are the temperature in each of the first portion 122, the second portion 130, the third portion 166, and the fourth portion 168 of the showerhead 116, the flow rate of the material delivered to each of the first portion 122, the second portion 130, the third portion 166, and the fourth portion 168 of the showerhead 116, the flow regime within the material delivery components (e.g., molecular flow), the temperature of each of the first ampoule 118, the second ampoule 126, the third ampoule 174, and the fourth ampoule 176, the temperature gradient from each of the ampoules 118, 126, 174, 176 to the showerhead 116, and the pressure of the process chamber 102. Controlling these factors determine the deposition rate of the material, resulting in films of desirable compositions formed on the surface of the substrate 114.

In some embodiments, each of the above factors can be controlled by a controller 136. The controller 136 is in communication with hardware contained within the entire process system 100, including hardware contained within the process chamber 102. The controller 136 may include a central processing unit (CPU) 136A, memory 136B, and support circuits (or I/O) 136C. The CPU 136A may be one of any form of computer processors that are used in industrial settings for controlling various processes and hardware (e.g., motors, valves, power delivery components, and other related hardware) and monitor the processes (e.g., processing time and substrate position or location). The memory 1366 is connected to the CPU 136A, and may be one or more of a readily available memory, such as random access memory (RAM), read only memory (ROM), floppy disk, hard disk, or any other form of digital storage, local or remote. Software instructions, algorithms and data can be coded and stored within the memory 136B for instructing the CPU 136A. The support circuits 136C are also connected to the CPU 136A for supporting the processor in a conventional manner. The support circuits 136C may include conventional cache, power supplies, clock circuits, input/output circuitry, subsystems, and the like. A program (or computer instructions) readable by the controller determines which tasks are performable within the process system 100. The program may be software readable by the controller 136 and may include code to monitor and control, for example, the parameters that determine the mass flow rate out of the showerhead 116 and the rotation rate of the pedestal 112, as is described further below in FIG. 3.

Figure 2:
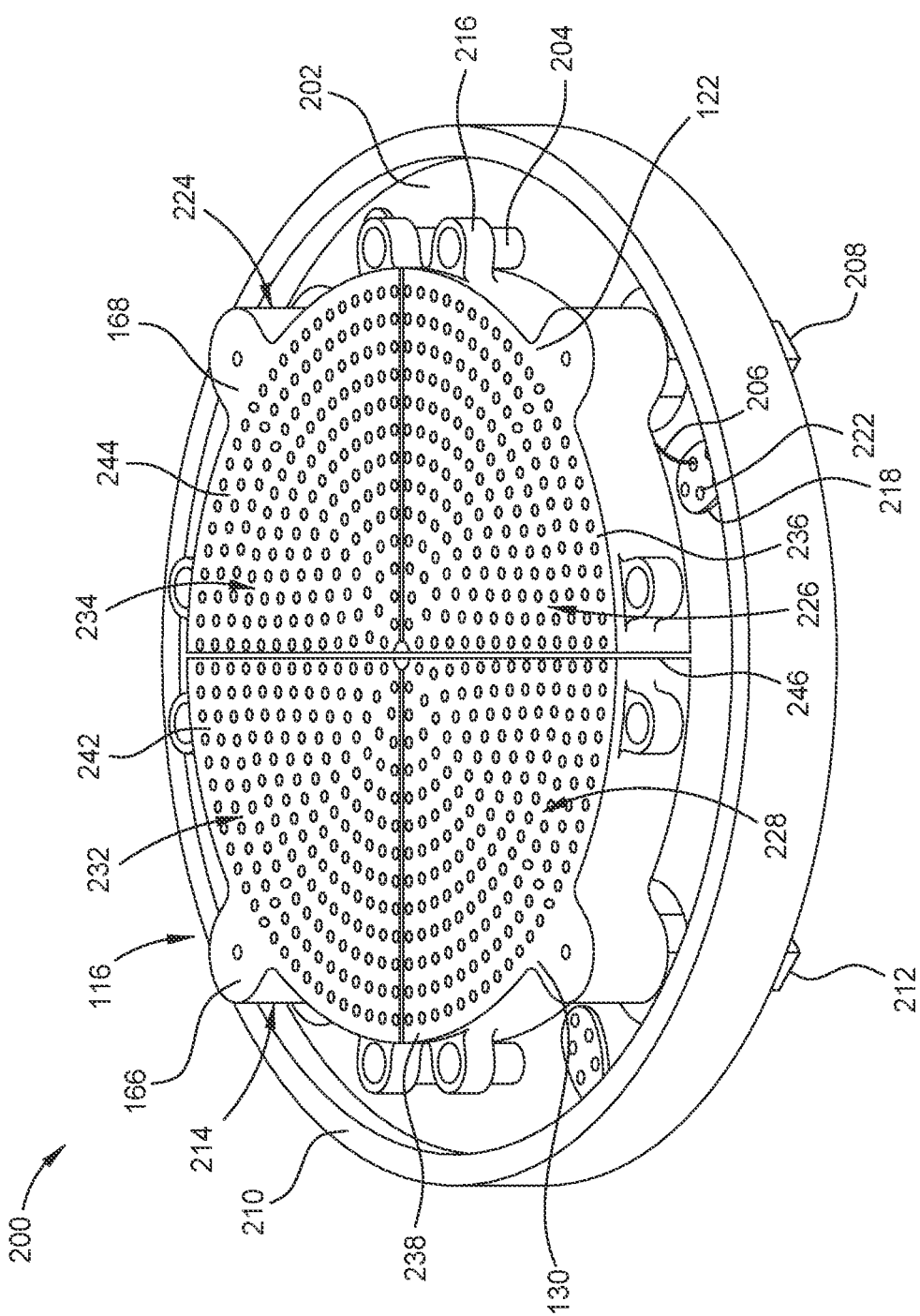
FIG. 2 is a bottom isometric view of the showerhead shown in FIG. 1 according to at least one embodiment described herein.

FIG. 2 shows a bottom isometric view of a showerhead assembly 200 according to at least one embodiment described herein. As shown, the showerhead 116 includes a plurality of portions including the first portion 122, the second portion 130, the third portion 166, and the fourth portion 168. The plurality of portions 122, 130, 166, and 168 can be coplanar and together form the showerhead 116 having a circular shape. In some embodiments, the showerhead diameter is about 300 mm to about 500 mm. In some embodiments, the showerhead diameter corresponds with a diameter of the substrate 114. In some embodiments, the plurality of portions can include three portions. In some embodiments, the plurality of portions can include six portions. The plurality of portions 122, 130, 166, and 168 are arranged such that there is a gap 246 between each portion. The spaced relation between the portions 122, 130, 166, and 168 advantageously reduces or prevents thermal cross-talk between each portion prior to exiting into the process chamber 102.

In some embodiments, the showerhead assembly 200 includes the showerhead 116 mounted to a lid plate 210. The lid plate 210 has a plurality of mounts 204 extending from a bottom surface 202 of the lid plate 210. Each of the portions 122, 130, 166, and 168 of the showerhead 116 include one or more mounts 216 that are capable of mating with corresponding mounts 204 of the lid plate 210 to couple the showerhead 116 to the lid plate 210. In some embodiments, the one or more mounts 216 extend from a radially outer surface of the showerhead 116. In some embodiments, the mounts 204, 216 are made of an insulative material.

In some embodiments, as shown in FIG. 2, the plurality of portions 122, 130, 166, and 168 are similar in size. In some embodiments, the plurality of portions may be different sizes. The first portion 122 includes a first inlet 208 extending through an opening in the lid plate 210. Similarly, the second portion 130, the third portion 166, and the fourth portion 168 include a second inlet 212, a third inlet 214, and a fourth inlet 224, respectively, each extending through an opening in the lid plate 210. In some embodiments, each inlet 208, 212, 214, 224 is disposed adjacent a respective outer portion of each gas delivery portion 122, 130, 166, and 168.

The first portion 122 includes a plurality of openings 226 extending from a bottom surface 236. The plurality of openings 226 are configured to deliver a process gas into the process chamber 102. The portions 130, 166, and 168 include a plurality of openings 228, 232, 234, respectively, extending from their respective bottom surfaces 238, 242, 244. The plurality of openings 228, 232, 234 are configured to deliver a process gas from each of the portions 130, 166, and 168 into the process chamber 102. The plurality of openings 226, 228, 232, 234 may be arranged in any pattern suitable for uniformly depositing process materials onto the substrate 114. In some embodiments, the plurality of openings 226, 228, 232, 234 have a diameter of about 0.1 mm to about 3 mm.

The showerhead 116 and lid plate 210 include a plurality of feedthrough plates 218. The plurality of feedthrough plates 218 are configured to allow wires to pass from the showerhead 116 through the lid plate 210. The wires can be heater wires, sensor wires, or the like. In some embodiments, the each of the plurality of feedthrough plates 218 includes a plurality of openings 222. In some embodiments, a feedthrough plate 218 is disposed next to each of the plurality of portions 122, 130, 166, and 168. In some embodiments, one or more heater wires 206 (one shown) are configured to pass through one of the feedthrough plates 218 and into the first portion 122.

Figure 3:
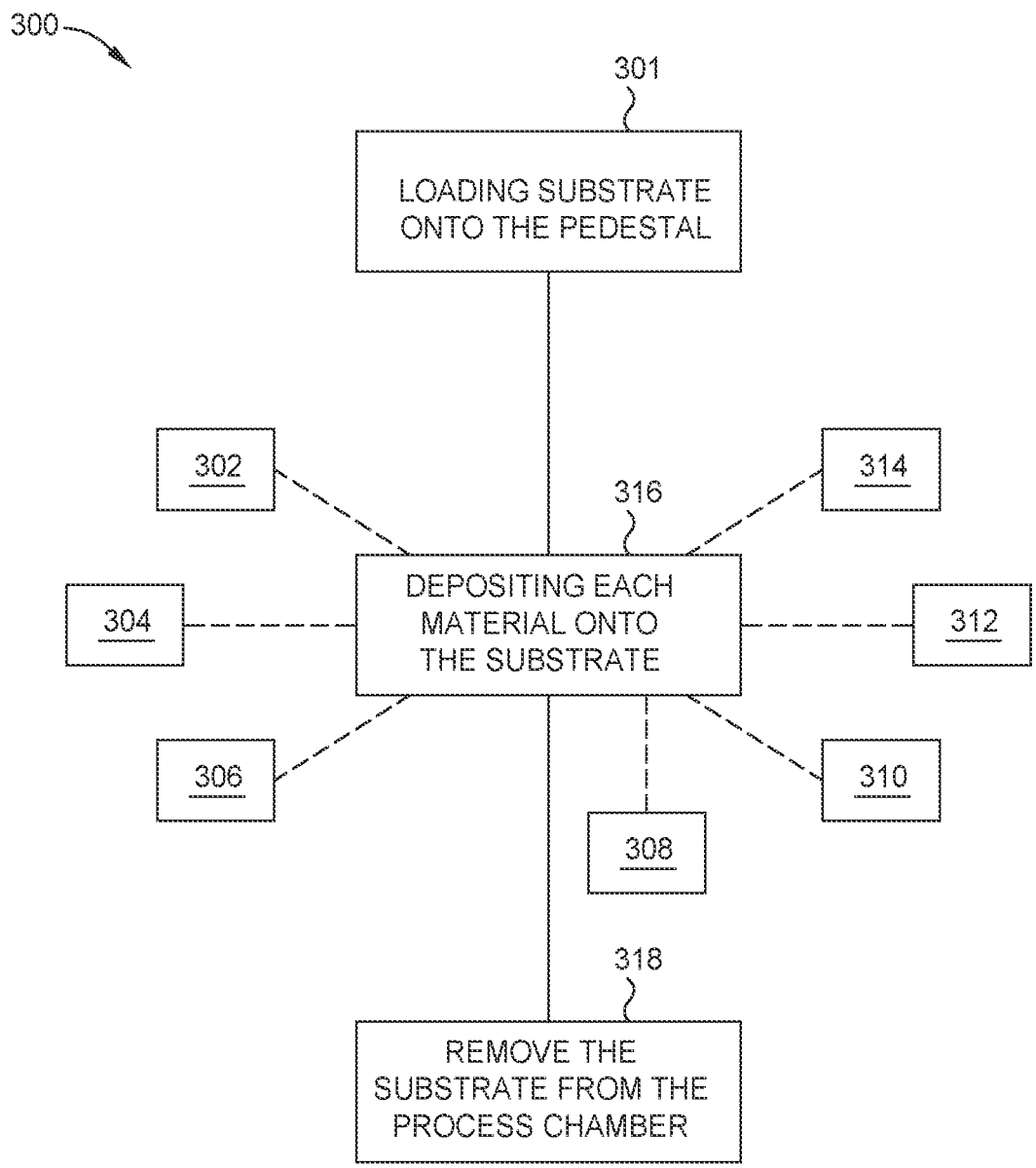
FIG. 3 is a flow chart of a method according to at least one embodiment described herein.

FIG. 3 is flow chart of a method 300 according to at least one embodiment described herein. In these embodiments, the method 300 is performed with the systems and devices described in FIGS. 1-2, but is not limited to these systems and devices and can be performed with other similar systems and devices. To achieve the resulting films discussed above, the rotation rate of the pedestal 112, pressure within the process volume, and the mass flow rate out of the showerhead 116 control the composition and size of the various regions of the different materials used to form the resulting film. Some factors that determine the mass flow rate out of the showerhead 116 are the temperature of the showerhead 116, the flow restriction created by openings within each of portions of the showerhead 116, the flow regime (e.g., molecular flow) of each of the materials 162, 164, 178, 180 within different portions of the process system 100, the temperature of each of the ampoules 118, 126, 174, 176, the temperature gradient from each of the ampoules 118, 126, 174, 176 to the showerhead 116, and the pressure of the process chamber 102 in which the substrate 114 resides during processing. Each of the materials 162, 164, 178, 180 flowing out of the portions 122, 130, 166, 168 of the showerhead 116 can have different processing parameters, allowing for a controlled film deposition process that is used to form at least a portion of a device. Additionally, as discussed above, two opposing portions of the showerhead 116 can connect to the same ampoule to deposit the same material. For example, the first portion 122 and the third portion 166 can be connected to the same ampoule, such as the first ampoule 118 via the first delivery line 120, to deposit the first material 162. The second portion 130 and the fourth portion 168 can be connected to the second ampoule 126 via the second delivery line 128 to deposit the second material 162. As such, two materials or three materials can be deposited on a substrate using the components found in the process system 100.

In block 301, the substrate 114 is loaded onto the pedestal 112. In block 316, each of the materials 162, 164, 178, 180 flowing out of the showerhead 116 is deposited onto the substrate 114, resulting in film(s) as shown and described below in FIGS. 4A-4B. In some embodiments, all of the materials 162, 164, 178, 180 are deposited onto the substrate 114. In other embodiments, three of the materials 162, 164, 178, 180 are deposited onto the substrate 114. In other embodiments, two of the materials 162, 164, 178, 180 are deposited onto the substrate 114. In general, the deposition of one or more of the materials onto the substrate 114 at any one time during the process of block 316 is completed by simultaneously controlling and completing the processes at least described in blocks 302-314.

In block 302, the temperature of each of the ampoules 118, 126, 174, 176 is controlled. The temperature and pressure within each of the ampoules 118, 126, 174, 176 is high enough such that evaporation of the solid or liquid material resident in each ampoule is able to occur. The temperature of the delivery lines 120, 128, 171, 173 is also maintained at a desired temperature by use of the heating elements 124, 132, 170, 172 described in FIG. 1. The temperatures of each of the ampoules 118, 126, 174, 176 and each of the delivery lines 120, 128, 171, and 173 can be controlled within a range from about 20 degrees Celsius to about 1200 degrees Celsius, such as between about 100 degrees Celsius and about 600 degrees Celsius. The pressure within the chamber process volume, process volumes of the ampoules and delivery lines in the process system 100 during processing can be less than $1\times10^{-8}$ Torr. In other embodiments, the pressure can be between about $1\times10^{-8}$ Torr and about $1\times10^{-5}$ Torr, such as between about $1\times10^{-7}$ Torr to about $1\times10^{-6}$ Torr.

In some embodiments, the temperature of each of the ampoules 118, 126, 174, and 176 can be between about 100 degrees Celsius and about 600 degrees Celsius. In some embodiments, the temperature of each of the ampoules 118, 126, 174, 176 is different and in other embodiments can be substantially the same. In some embodiments, the temperature of each of the delivery lines 120, 128, 171, 173 is maintained at a temperature that is higher than the temperature of each of the ampoules 118, 126, 174, 176. In other embodiments, the temperature of each of the delivery lines 120, 128, 171, 173 is maintained at a temperature that is about equal to the temperature of each of the ampoules 118, 126, 174, 176. Additionally, in some embodiments, the temperature of the first ampoule 118, first delivery line 120, and first portion 122 of the showerhead 116 are all substantially similar, leading to more uniform mass flow of the first material 162. In some embodiments, the temperature of the second ampoule 126, second delivery line 128, and second portion 130 of the showerhead 116 are all substantially similar, also leading to more uniform mass flow of the second material 162. In some embodiments, the temperature of the third ampoule 174, third delivery line 171, and third portion 166 of the showerhead 116 are all substantially similar, also leading to more uniform mass flow of the third material 178. In some embodiments, the temperature of the fourth ampoule 176, fourth delivery line 173, and fourth portion 168 of the showerhead 116 are all substantially similar, also leading to more uniform mass flow of the fourth material 180.

In block 304, the first material 162 is delivered from the first ampoule 118 through the first delivery line 120 and into the first portion 122 of the showerhead 116 and into the process volume 110 of the process chamber 102, and either simultaneously or sequentially the second, third, and fourth materials 164, 178, 180 are delivered from the second, third, and fourth ampoules 126, 174, 176 through the respective second, third, and fourth delivery lines 128, 171, 173 and into the respective second, third, and fourth portions 130, 166, 168 of the showerhead 116 and into the process volume 110 of the process chamber 102. In some embodiments, the pressure within the process system 100 can be maintained such that the flow of each material out of an ampoule is controlled so that the flow of material is within a desired flow regime, such as the molecular flow regime. As such, the flow of each of the evaporated material is controlled by the temperature of and pressure within each of the ampoules 118, 126, 174, 176 (as discussed above) and the surface area of each of the materials 162, 164, 178, 180 within each of the ampoules 118, 126, 174, 176. The materials 162, 164, 178, 180 disposed in each of the ampoules 118, 126, 174, 176 can include any material for sublimation and condensation on a substrate, for example Tris(8-hydroxyquinolinato), aluminum (Alq3), or Buckminsterfullerene ($C_{60}$).

In block 306, the mass flow rate of material from each of the portions 122, 130, 166, 168 of the showerhead 116 is controlled. The mass flow rates are controlled by controlling the pressures and temperatures throughout the process system 100. The mass flow from each of the portions 122, 130, 166, 168 of the showerhead 116 can be between about $1\times10^{-4}$ kg/(m²*s) to about 0.25 kg/(m²*s). Additionally, the deposition rate from each of the portions 122, 130, 166, 168 of the showerhead 116 can be between about 0.01 Å/s and about 10 Å/s, such as between about 0.5 Å/s and 5 Å/s. As discussed above, maintaining pressures below certain thresholds for each of the materials 162, 164, 178, 180 provides a molecular flow regime through which the evaporated material will flow. In some embodiments, the flow rate of each of the portions 122, 130, 166, 168 can be different. In other embodiments, the ratios of the flow rates of the vaporized material flowing from one of the portions 122, 130, 166, 168 to another one of the portions 122, 130, 166, 168 can be more than 1:100, such as between about 1:1 and 1:100. However, in other embodiments, the flow rate of each of the portions 122, 130, 166, 168 can be substantially the same.

In block 308, the temperature of each portion of the showerhead 116 is controlled. The temperature of each of the portions 122, 130, 166, 168 is high enough such that it prevents condensation. Additionally, as discussed above, the temperature of the each of the ampoules and the temperature gradients between each of the ampoules 118, 126, 174, 176 and the showerhead 116 also affects the material flux of each of the materials 162, 164, 178, and 180 coming out of the showerhead 116. When the temperature of a portion of the showerhead 116 increases, the material flux of the material exiting the portion of the showerhead 116 increases. The temperatures can range from about 20 degrees Celsius to about 1200 degrees Celsius, such as between about 100 degrees Celsius and about 600 degrees Celsius. In some embodiments, the temperature of each of the portions 122, 130, 166, 168 can be different. However, in other embodiments, the temperature of each of the portions 122, 130, 166, 168 can be substantially the same.

In block 310, each of the materials 162, 164, 178, 180 is flowed from the each of the portions 122, 130, 166, 168 of the showerhead 116 into the process volume 110 of the process chamber 102.

In block 312, the pressure within the process chamber 102 is controlled. In some embodiments, the pressure within the process chamber 102 can be between about $1\times10^{-9}$ Torr and about $1\times10^{-5}$ Torr, such as between about $1\times10^{-7}$ Torr to about $1\times10^{-6}$ Torr. Controlling the pressure within the process chamber 102 determines the flow regime of the materials 162, 164, 178, 180 entering the process volume 102. By increasing or decreasing the mass flow rate increases or decreases the deposition rate of each of the materials onto the surface of the substrate 114.

In block 314, the rotation rate of the pedestal 112 is controlled. The pedestal 112 is configured to rotate at a speed such that it results in films with desirable material domain sizes when co-depositing the multiple process materials flowing out of the showerhead 116 onto the substrate 114. In some embodiments, the rotation rate can be between about 0 to about 200 RPM, such as between 5 and about 100 RPM, or between 10 and 70 RPM. Controlling the speed of the rotation of the pedestal 112 helps form suitable devices. When the rotation of the pedestal 112 is slower than desired in forming certain devices, the domain sizes may be too large, such that the materials do not mix well to provide sufficient interface area. When the rotation of the pedestal 112 is faster than desired to form certain devices, domain sizes may be too small, such that no sufficient path is formed for each material for efficient charge transport in the devices. The material flux of each of the materials 164, 162, 178, 180 also affects how the speed of the pedestal 112 should be controlled. When the material flux is higher, the deposition rate onto the substrate 114 is higher, meaning the rotation rate of the pedestal 112 should be controlled to a higher speed for the film to result in similar domain sizes. When the material flux is lower, the deposition rate onto the substrate 114 is lower, meaning the rotation rate of the pedestal 112 should be controlled to a lower speed to result in similar domain sizes.

In block 318, the substrate 114 is removed from the process chamber 102. Overall, the method 300 advantageously results in desired films having a desired thickness and composition being deposited on the substrate 114 such that they can form at least a portion of a suitable device, such as OLEDs or other optical devices. For example, the method 300 can result in regions of formed layer(s) that look similar to what is shown in FIG. 4A or 4B.

Figure 4B:
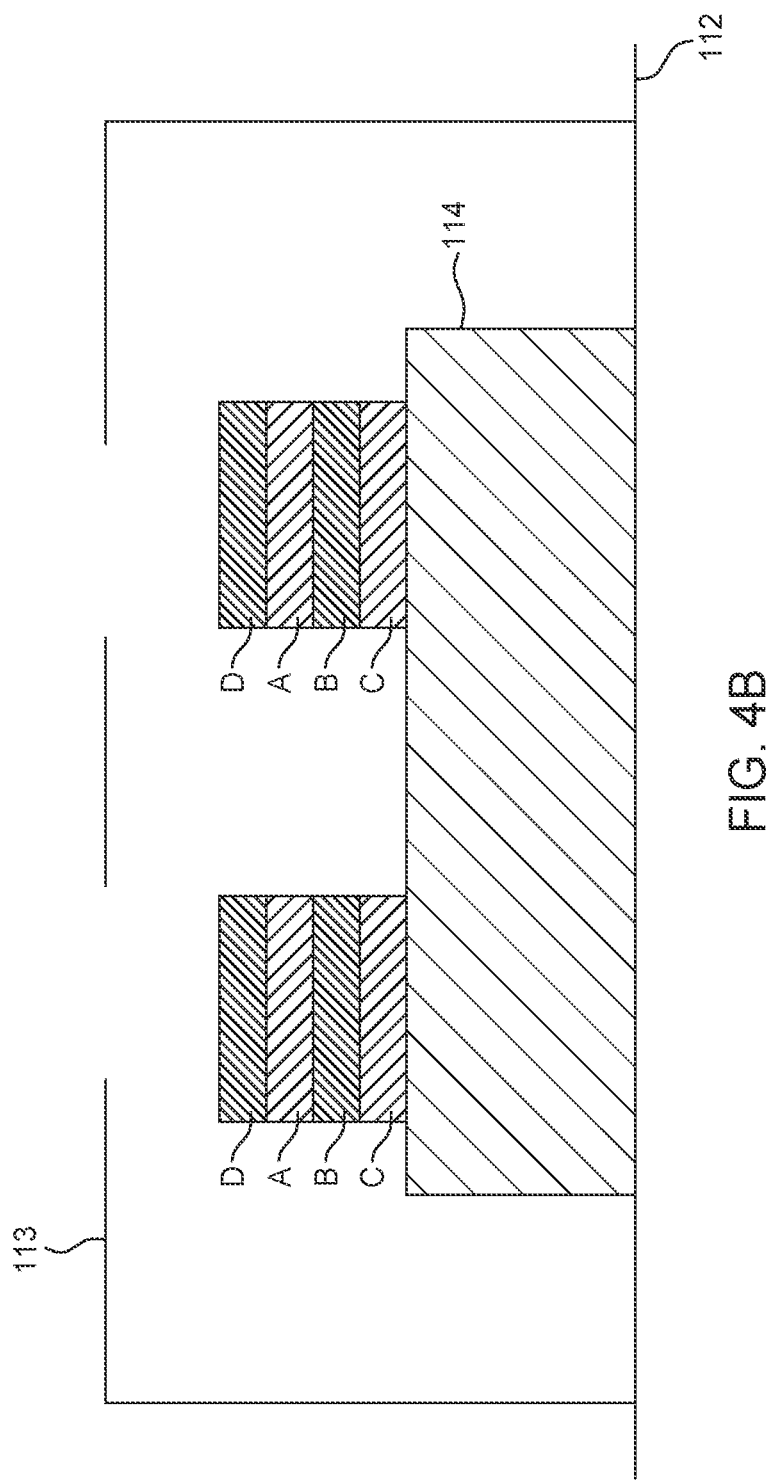

FIGS. 4A-4B are schematic views of the process chamber after the method 300 shown in FIG. 3 is performed according to some embodiments described herein. FIG. 4A shows multiple materials (represented by A, B, C, D) mixed within a single formed layer. The result shown generally occurs when the rotational speed is faster, such as greater than about 10 RPM. Although a mix of four materials A, B, C, and D are shown within a single film in FIG. 4A, in other embodiments, there can be a mix of two materials, such as A/B, A/C, A/D, B/C, and B/D. In other embodiments, there can be a mix of three or more materials, such as A/B/C, B/C/D, and A/C/D. In other embodiments, a mix of more than four materials can occur. Mixed materials within a single film are important for the optical and/or electrical properties of certain devices, such as the charge transport of certain devices.

FIG. 4B shows multiple materials (represented by A, B, C, D) forming a superlattice structure. The result shown in FIG. 4B generally occurs when the rotational speed is slower, such as slower than 1 RPM. Although four materials A, B, C, and D are stacked in FIG. 4B, in other embodiments, there can be alternating stacks of two materials such as A/B/N/B, for example. In other embodiments, there can be stacks of three materials, such as A/B/C, B/C/D, and A/C/D. In other embodiments, stacks of more than four materials can occur. In some cases the stacks of two or more layers may be repeated two or more times, such as, for example, a three layer stack may include a two group stack A/B/C/A/B/C, where A/B/C is the repeating group. The resulting superlattice structures are useful in certain optoelectronic devices. Additionally, these devices can be formed with non-stop deposition to improve throughput.

In embodiments described herein, the size of the resulting regions of films across the surface of the substrate 114 are determined by the deposition mass flow rate (or material flux) out of the showerhead 116, pressure within the process volume and the rotation rate of the pedestal 112. Some factors that determine the mass flow rate deposition out of the showerhead 116 are the temperature of the showerhead 116, the incoming temperature of the material being provided to the showerhead 116, the flow rate restriction created by openings within each showerhead portion, the flow regime (e.g., molecular flow) of the material within different portions of the process system 100, the temperature of each of the ampoules 118, 126, 174, 176, the temperature gradient from each of the ampoules 118, 126, 174, 176 to the showerhead 116, and the pressure of the process chamber 102 in which the substrate 114 resides during processing. Controlling each of these factors as described above in the method 300 controls the deposition rate of the materials deposited onto the substrate 114, resulting in desired films deposited on the surface of the substrate 114.

Also, by varying the various process variables described above, such as the deposition material flux and timing of the delivery of each deposited material, the composition of one or more deposited layers can be adjusted in a direction of growth (i.e., perpendicular to the exposed surface of the substrate) and/or in a lateral direction (i.e., parallel to the exposed surface of the substrate) as the one or more deposited layers grow. Thus, for example, by adjusting the mass flow rate and overlap or spacing in time of the delivery of each component material in one or more deposited layers the composition of a layer or different portions of any one of the one or more deposited layers can be controlled.

While the foregoing is directed to implementations of the present invention, other and further implementations of the invention may be devised without departing from the basic scope thereof, and the scope thereof is determined by the claims that follow.

We claim:

1. A process system for forming a film on a substrate, comprising:
   a plurality of ampoules;
   a process chamber comprising:
      a showerhead, wherein the showerhead comprises a plurality of separate portions; and
      a pedestal;
   a plurality of delivery lines, wherein each delivery line of the plurality of delivery lines is connected from one of the plurality of ampoules to one of the plurality of separate portions of the showerhead; and
   a controller configured to regulate operation of the process system, wherein the controller comprises a memory containing instructions for execution on a processor comprising:
      controlling a temperature of and a pressure within a processing volume of each of the plurality of ampoules, wherein:
         different materials are disposed within the process volume of each of the plurality of ampoules,
         the process volume of each of the plurality of ampoules are in fluid communication with one of the plurality of separate portions of the showerhead that is coupled to a process volume of the process chamber, and
         the controlled temperature is configured to cause each of the different materials to evaporate within each of the process volumes of the plurality of ampoules and flow to one of the plurality of separate portions of the showerhead;
      controlling a flow rate of each of the different materials from each of the plurality of separate portions of the showerhead and into the process volume of the process chamber by separately controlling the temperature of each of the plurality of separate portions of the showerhead, wherein each separate portion of the plurality of separate portions of the showerhead are heated by separate heating elements;
      controlling a pressure within the process chamber; and
      controlling a rotation rate of a substrate on the pedestal disposed within the process volume of the process chamber, wherein the substrate is exposed to the flow of different materials provided from each of the plurality of separate portions of the showerhead.

2. The process system of claim 1, wherein the controlled temperature of each ampoule of the plurality of the ampoules is different.

3. The process system of claim 1, wherein the controlled temperature of each ampoule of the plurality of the ampoules is substantially the same.

4. The process system of claim 1, wherein the controlled flow rate of each of the different materials from each portion of the plurality of separate portions of the showerhead is different.

5. The process system of claim 1, wherein the controlled flow rate of each of the different materials from each portion of the plurality of separate portions of the showerhead is substantially the same.

6. The process system of claim 1, wherein the controlled pressure within the process chamber is between about $1 \times 10^{-8}$ Torr and about $1 \times 10^{-5}$ Torr.

7. The process system of claim 1, wherein the controlled rotation rate of the pedestal is between about 0 RPM and about 200 RPM.

8. A process system for forming a film on a substrate, comprising:
- a first ampoule and a second ampoule;
- a process chamber comprising:
  - a showerhead, wherein the showerhead comprises a plurality of separate portions; and
  - a pedestal;
- a plurality of delivery lines, wherein each delivery line of the plurality of delivery lines is connected from one each of the first ampoule and the second ampoule to one of the plurality of portions of the showerhead; and
- a controller configured to regulate operation of the process system, wherein the controller comprises a memory containing instructions for execution on a processor comprising:
  - controlling a temperature of and a pressure within a processing volume of the first ampoule, wherein:
    - a first material is disposed within the process volume of the first ampoule,
    - the process volume of the first ampoule is in fluid communication with a first separate portion of a plurality of separate portions of a showerhead that is coupled to a process volume of a process chamber, wherein the first separate portion of the plurality of separate portions of the showerhead has an input in fluid communication exclusively with a plurality of openings of the first separate portion of the showerhead, and
    - the controlled temperature is configured to cause the first material to evaporate within the process volume of the first ampoule and flow to the input of the first separate portion of the showerhead;
  - controlling a temperature of and pressure within a process volume of the second ampoule, wherein:
    - a second material is disposed within the process volume of the second ampoule,
    - the process volume of the second ampoule is in fluid communication with a second separate portion of the plurality of separate portions of the showerhead that is coupled to the process volume of the process chamber, wherein the second separate portion of the plurality of separate portions of the showerhead has an input in fluid communication exclusively with a plurality of openings of the second separate portion of the showerhead, and
    - the controlled temperature is configured to cause the second material to evaporate within the process volume of the second ampoule and flow to the input of the second separate portion of the showerhead;
  - controlling a flow rate of the first material from the first separate portion of the showerhead and into the process volume of the process chamber by controlling the temperature of the first separate portion of the plurality of separate portions of the showerhead, wherein the first separate portion of the plurality of separate portions of the showerhead is heated by a first heating element;
  - controlling a flow rate of the second material from the second separate portion of the showerhead and into the process volume of the process chamber by controlling the temperature of the second separate portion of the plurality of separate portions of the showerhead, wherein the second separate portion of the plurality of separate portions of the showerhead is heated by a second heating element;
  - controlling a pressure within the process chamber;
  - controlling a rotation rate of a substrate on a pedestal disposed within the process volume of the process chamber, wherein the substrate is simultaneously or sequentially exposed to the flow of the first material and the second material provided from the first separate portion and the second separate portion of the plurality of separate portions of the showerhead.

9. The process system of claim 8, wherein the controlled temperature of each of the first ampoule and the second ampoule is different.

10. The process system of claim 8, wherein the controlled temperature of each of the first ampoule and the second ampoule is substantially the same.

11. The process system of claim 8, wherein the controlled flow rate of each of the first separate portion and the second separate portion of the showerhead is different.

12. The process system of claim 8, wherein the controlled flow rate of each of the first separate portion and the second separate portion of the showerhead is substantially the same.

13. The process system of claim 8, wherein the controlled pressure within the process chamber is between about $1 \times 10^{-8}$ Torr and about $1 \times 10^{-5}$ Torr.

14. The process system of claim 8, wherein the controlled rotation rate of the pedestal is between about 0 RPM and about 200 RPM.

* * * * *